United States Patent
Namie et al.

(10) Patent No.: US 12,206,374 B2
(45) Date of Patent: Jan. 21, 2025

(54) POWER AMPLIFYING CIRCUIT

(71) Applicant: Murata Manufacturing Co., Ltd., Kyoto (JP)

(72) Inventors: Hisanori Namie, Kyoto (JP); Satoshi Goto, Kyoto (JP); Tomoaki Sato, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 599 days.

(21) Appl. No.: 17/363,627

(22) Filed: Jun. 30, 2021

(65) Prior Publication Data
US 2022/0006437 A1 Jan. 6, 2022

(30) Foreign Application Priority Data
Jul. 1, 2020 (JP) .................. 2020-114450

(51) Int. Cl.
*H03F 1/56* (2006.01)
*H03F 3/45* (2006.01)
*H03G 3/30* (2006.01)

(52) U.S. Cl.
CPC ....... *H03G 3/3042* (2013.01); *H03F 3/45475* (2013.01); *H03F 2200/06* (2013.01); *H03F 2200/09* (2013.01); *H03G 2201/103* (2013.01)

(58) Field of Classification Search
CPC ............. H03F 3/45475; H03F 2200/06; H03F 2200/09; H03F 3/26; H03F 3/195; H03F 3/213; H03F 3/45928; H03F 2200/451; H03F 2200/537; H03F 3/211; H03F 1/56; H03F 3/68; H03F 2200/48; H03G 3/3042; H03G 2201/103

USPC ......................................................... 330/254
See application file for complete search history.

(56) References Cited

U.S. PATENT DOCUMENTS

| | | | |
|---|---|---|---|
| 6,625,430 B2 * | 9/2003 | Doherty | H04B 1/0458 330/51 |
| 9,160,377 B2 | 10/2015 | Lee et al. | |
| 11,671,061 B2 * | 6/2023 | Gebeyehu | H04B 1/401 330/276 |
| 2011/0115565 A1 | 5/2011 | Cabanillas | |

(Continued)

FOREIGN PATENT DOCUMENTS

JP 2014-225862 A 12/2014
KR 10-2012-0093357 A 8/2012

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A power amplifying circuit includes a single-ended amplifier, a differential amplifier, a first balun transformer, a second balun transformer, and a first switching circuit. The single-ended amplifier operates in a first mode and a second mode different from the first mode. The differential amplifier operates in the second mode. The first balun transformer converts an unbalanced output signal from the single-ended amplifier into a differential signal and outputs the differential signal to the differential amplifier. The second balun transformer converts a balanced output signal from the differential amplifier into an unbalanced output signal. The first switching circuit outputs the unbalanced output signal from the single-ended amplifier in the first mode and outputs the unbalanced output signal from the second balun transformer in the second mode.

10 Claims, 19 Drawing Sheets

(56) References Cited

U.S. PATENT DOCUMENTS

2014/0312972 A1 10/2014 Yoneda et al.
2020/0091879 A1 3/2020 Lyalin et al.

* cited by examiner

POWER AMPLIFYING CIRCUIT

CROSS REFERENCE TO RELATED APPLICATION

This application claims priority from Japanese Patent Application No. 2020-114450 filed on Jul. 1, 2020. The content of this application is incorporated herein by reference in its entirety.

BACKGROUND

The present disclosure relates to a power amplifying circuit.

A wide variety of power amplifying circuits installed in wireless communication terminal apparatuses employ multi-stage configurations using multiple amplifiers in order to obtain their desired gains. For example, Japanese Unexamined Patent Application Publication No. 2014-225862 describes a power amplifying circuit having a two-stage configuration including a single-ended amplifier and a differential amplifier.

In such a power amplifying circuit having a multi-stage configuration including a single-ended amplifier and a differential amplifier, a function of switching gain may be required. For example, a configuration of switching between a single-ended amplifier, whose gain is relatively low, and a differential amplifier, whose gain is relatively high, is disclosed (for example, see U.S. Pat. No. 9,160,377).

The configuration described in U.S. Pat. No. 9,160,377, in which a switching circuit switches between a power amplification path using the single-ended amplifier and a power amplification path using the differential amplifier, may cause the circuit configuration to be complicated.

BRIEF SUMMARY

The present disclosure provides a power amplifying circuit, which is capable of switching gain, with a simple configuration.

A power amplifying circuit according to an aspect of the present disclosure includes a single-ended amplifier, a differential amplifier, a first balun transformer, a second balun transformer, and a first switching circuit. The single-ended amplifier operates in a first mode and a second mode different from the first mode. The differential amplifier operates in the second mode. The first balun transformer converts an unbalanced output signal from the single-ended amplifier into a differential signal, and outputs the differential signal to the differential amplifier. The second balun transformer converts a balanced output signal from the differential amplifier into an unbalanced output signal. The first switching circuit outputs the unbalanced output signal from the single-ended amplifier in the first mode, and outputs the unbalanced output signal from the second balun transformer in the second mode.

This configuration enables implementation of a power amplifying circuit, with a simple configuration, which is capable of switching between an amplification operation for obtaining a first gain (low gain), which is relatively low, in the first mode and an amplification operation for obtaining a second gain (high gain), which is relatively high, in the second mode.

Other features, elements, characteristics and advantages of the present disclosure will become more apparent from the following detailed description of embodiments of the present disclosure with reference to the attached drawings.

DETAILED DESCRIPTION

A power amplifying circuit according to embodiments will be described in detail below on the basis of the drawings. The embodiments do not limit the present disclosure. Components of the embodiments include those that are easily replaceable by those skilled in the art or those that are substantially identical to each other. The embodiments are exemplary, and configurations in different embodiments may be replaced or combined partially. Points common to those in a first embodiment will not be described in a second embodiment and its subsequent embodiments. Only different points will be described. Substantially the same effects caused by substantially the same configurations will not be particularly described in each embodiment.

First Embodiment

Figure 1A:
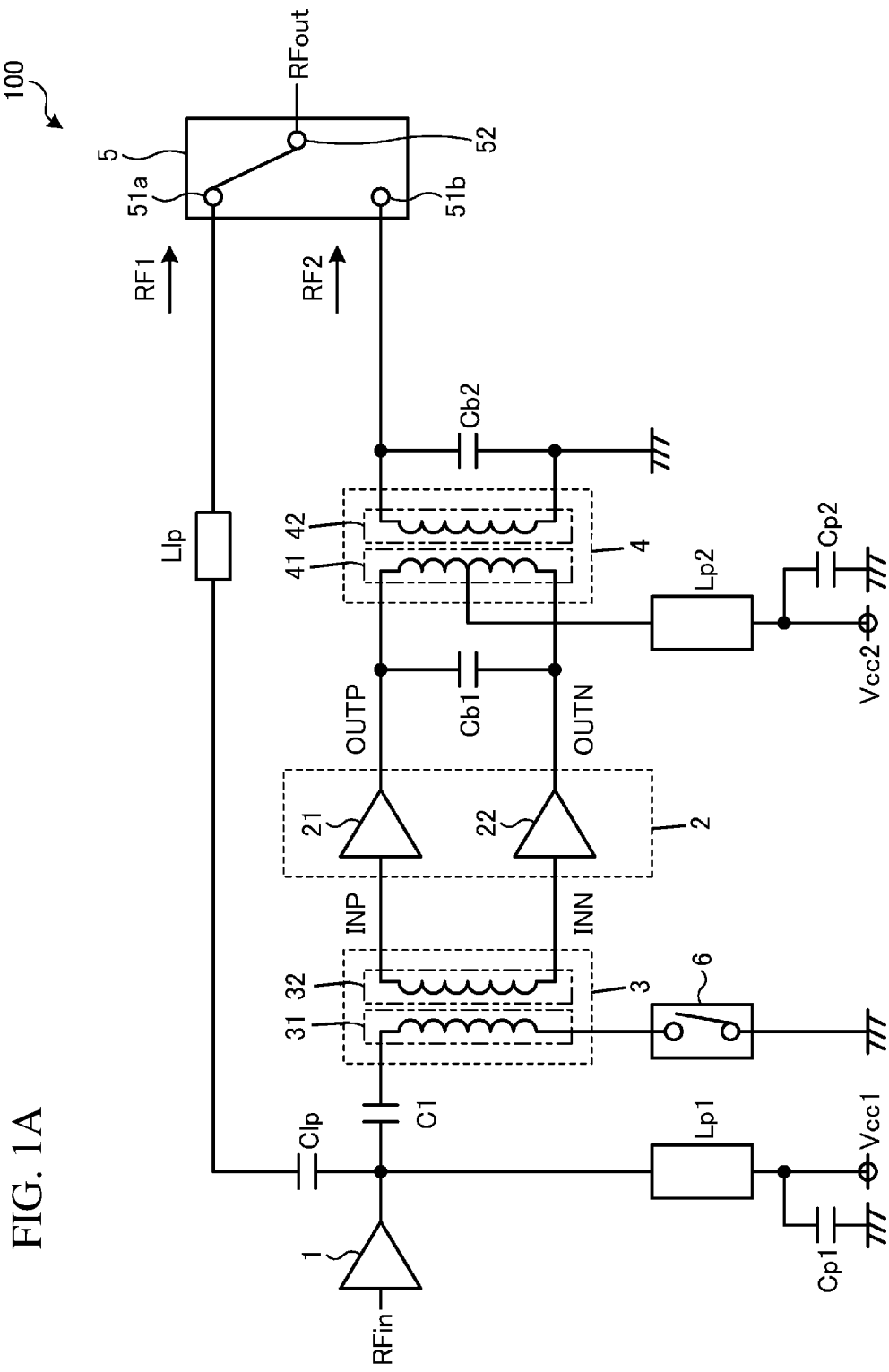
FIG. 1A is a diagram illustrating an exemplary configuration of a power amplifying circuit according to a first embodiment.
Figure 1B:
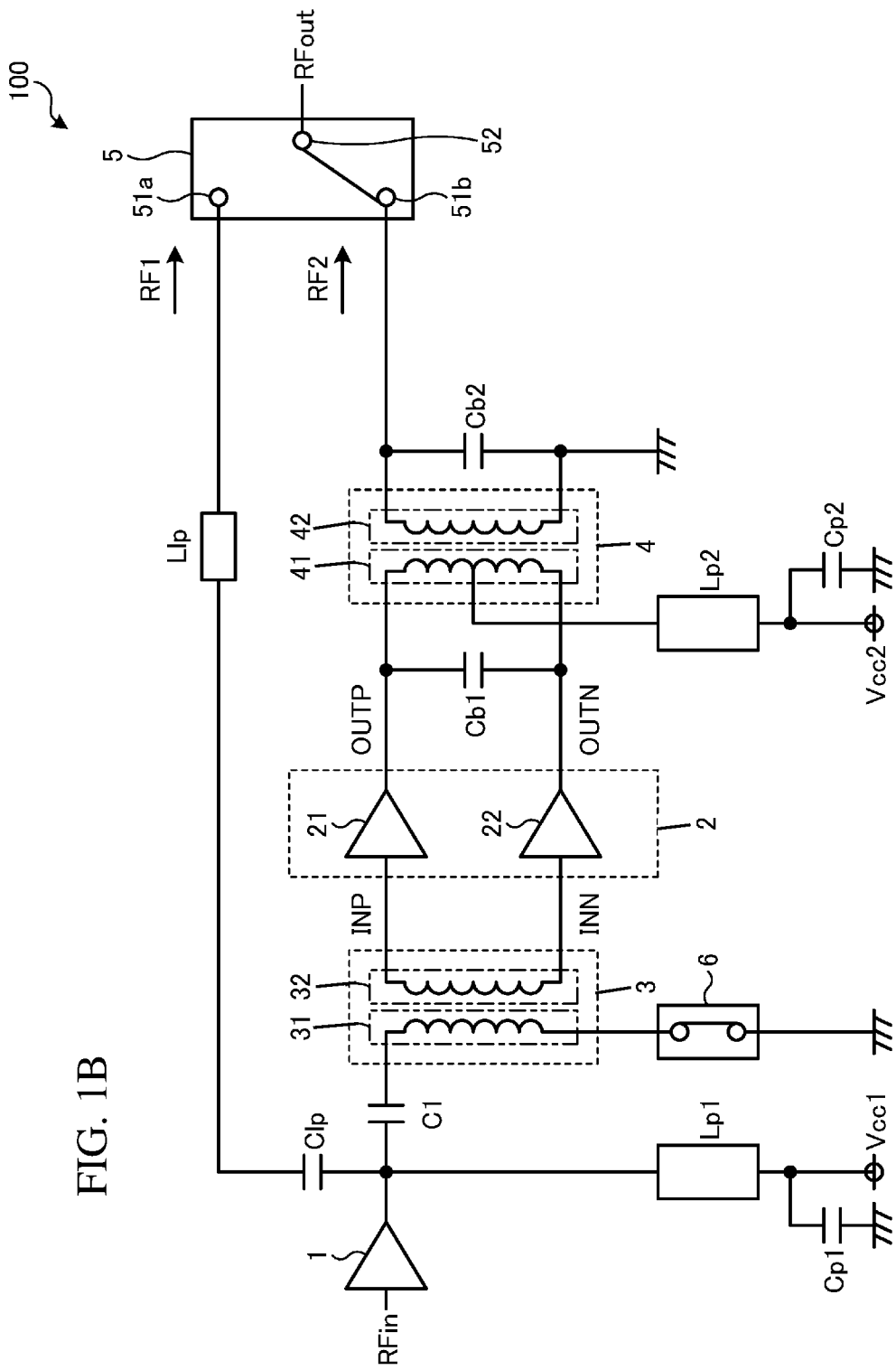
FIG. 1B is a diagram illustrating an exemplary configuration of a power amplifying circuit according to the first embodiment.

FIGS. 1A and 1B are diagrams illustrating exemplary configurations of a power amplifying circuit according to a first embodiment. A power amplifying circuit 100 according to the first embodiment performs amplification operations, on received radio-frequency input signals RFin, for obtaining a first gain (low gain) that is relatively low and for obtaining a second gain (high gain) that is relatively high, and outputs radio-frequency output signals RFout. The mode, in which an amplification operation for obtaining the first gain is performed, is referred to as the "first mode". The mode, in which an amplification operation for obtaining the second gain is performed, is referred to as the "second mode". FIG. 1A illustrates the state in the first mode. FIG. 1B illustrates the state in the second mode.

As illustrated in FIGS. 1A and 1B, the power amplifying circuit 100 according to the first embodiment includes a single-ended amplifier 1, a differential amplifier 2, a first balun transformer 3, a second balun transformer 4, and a first switching circuit 5.

The single-ended amplifier 1 operates in the first mode and the second mode by using the first power supply voltage Vcc1 which is input through an inductance device Lp1.

The single-ended amplifier 1 may be formed, for example, of a bipolar transistor, or may be formed, for example, of a field effect transistor (FET). In the case where the single-ended amplifier 1 is formed of a bipolar transistor, for example, a heterojunction bipolar transistor (HBT) may be used. The configuration of the single-ended amplifier 1 does not limit the present disclosure.

The first balun transformer 3 includes an input-side winding 31 and an output-side winding 32.

The single-ended amplifier 1 amplifies radio-frequency input signals RFin which are single-ended signals. Unbalanced output signals, which are output from the single-ended amplifier 1, are input to an input terminal 51a of the first switching circuit 5 through a capacitor C1p and an inductance device L1p. Unbalanced output signals, which are output from the single-ended amplifier 1, are input to a first end of the input-side winding 31 of the first balun transformer 3 through a capacitor C1 (first capacitor). The input-side winding 31 of the first balun transformer 3 is connected, at its second end, to a reference potential through a second switching circuit 6 in the second mode (see FIG. 1B). The reference potential is the ground potential, but this is not limiting.

The first balun transformer 3 converts unbalanced output signals, which are received from the single-ended amplifier 1, from unbalanced to balanced to obtain differential signals. The output-side winding 32 of the first balun transformer 3 is connected between the input INP and the input INN of the differential amplifier 2.

The input-side winding 31 of the first balun transformer 3 is coupled to the output-side winding 32 electromagnetically. Thus, unbalanced output signals, which are output from the single-ended amplifier 1, are converted from unbalanced to balanced by the first balun transformer 3.

The second balun transformer 4 includes an input-side winding 41 and an output-side winding 42.

The input-side winding 41 is connected between the output OUTP and the output OUTN of the differential amplifier 2. A center tap is provided at the midpoint of the input-side winding 41. The second power supply voltage Vcc2 is applied through an inductance device Lp2 to the center tap. The input-side winding 41 is connected to a capacitor Cb1 in parallel.

The output-side winding 42 is connected, at its first end, to the reference potential. The output-side winding 42 is connected to a capacitor Cb2 in parallel.

The differential amplifier 2 operates in the second mode by using the second power supply voltage Vcc2 which is input through the inductance device Lp2 and the input-side winding 41 of the second balun transformer 4.

The differential amplifier 2 includes two amplifiers 21 and 22 which amplify differential signals which are output from the first balun transformer 3. The amplifiers 21 and 22 may be formed, for example, of bipolar transistors, or may be formed, for example, of FETs. In the case where the amplifiers 21 and 22 are formed of bipolar transistors, for example, HBTs may be used. The configuration of the amplifiers 21 and 22 does not limit the present disclosure.

The input-side winding 41 of the second balun transformer 4 is coupled to the output-side winding 42 electromagnetically. Thus, balanced output signals, which are output from the differential amplifier 2, are converted from balanced to unbalanced by the second balun transformer 4.

Unbalanced output signals, which are output from the second balun transformer 4, are input to an input terminal 51b of the first switching circuit 5.

The first switching circuit 5 switches, for output, between unbalanced output signals from the single-ended amplifier 1 and unbalanced output signals from the second balun transformer 4. Specifically, in the first mode, the first switching circuit 5 connects the input terminal 51a to an output terminal 52 electrically (see FIG. 1A). In the second mode, the first switching circuit 5 connects the input terminal 51b to the output terminal 52 electrically (see FIG. 1B).

The configuration according to the first embodiment described above enables implementation of a power amplifying circuit, with a simple configuration, which is capable of switching between an amplification operation for obtaining the first gain (low gain), which is relatively low, in the first mode and an amplification operation for obtaining the second gain (high gain), which is relatively high, in the second mode.

Figure 2A:
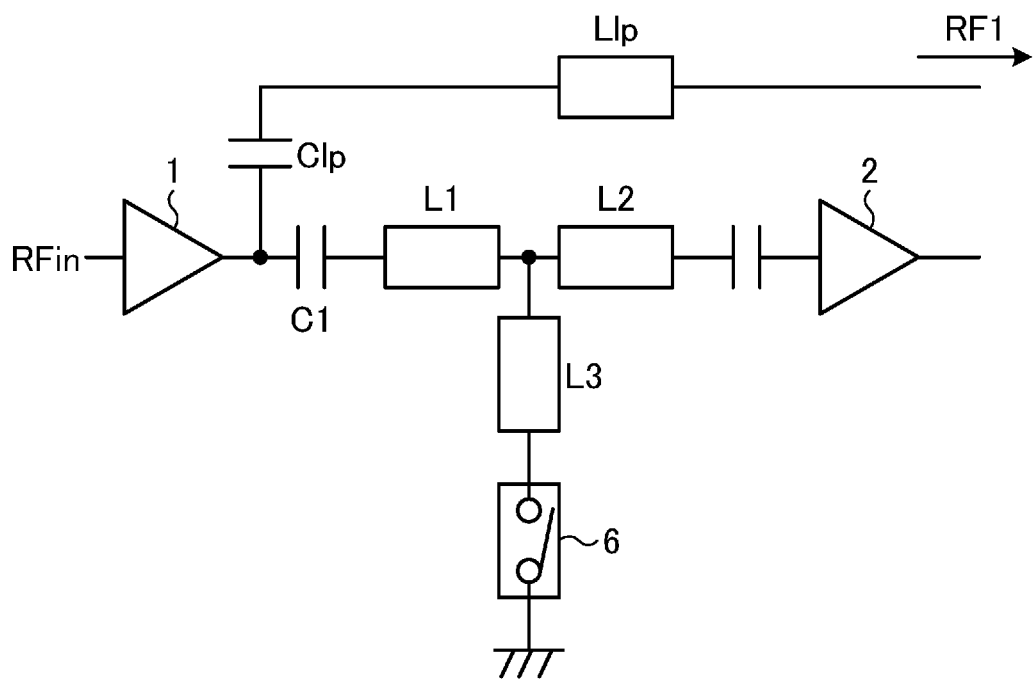
FIG. 2A is a diagram illustrating the equivalent circuit of a first balun transformer, in the first mode, of a power amplifying circuit according to the first embodiment.
Figure 2B:
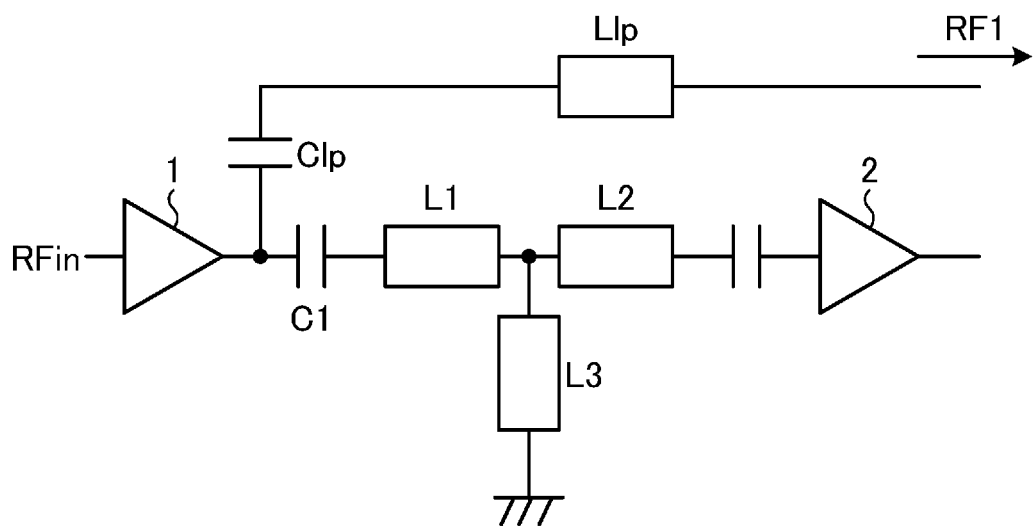
FIG. 2B is a diagram illustrating the equivalent circuit of a first balun transformer, in the first mode, of a power amplifying circuit according to a comparison example of the first embodiment.
Figure 3:
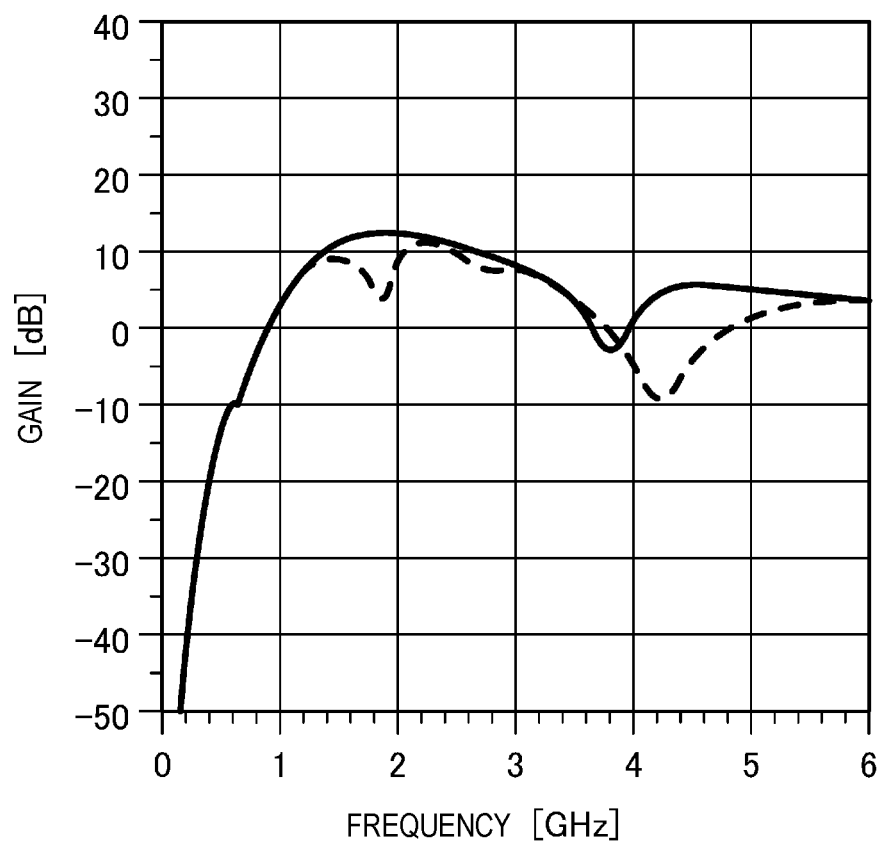
FIG. 3 is a diagram illustrating an exemplary simulation result of frequency-gain characteristics, in the first mode, of a power amplifying circuit according to the first embodiment.

FIG. 2A is a diagram illustrating the equivalent circuit of the first balun transformer, in the first mode, of the power amplifying circuit according to the first embodiment. FIG. 2B is a diagram illustrating the equivalent circuit of a first balun transformer, in the first mode, of a power amplifying circuit according to a comparison example of the first embodiment. FIG. 3 is a diagram illustrating an exemplary simulation result of frequency-gain characteristics, in the first mode, of the power amplifying circuit according to the first embodiment. In FIG. 3, the solid line indicates the simulation result, in the first mode, of the power amplifying circuit according to the first embodiment. The broken line indicates the simulation result, in the first mode, of the power amplifying circuit according to the comparison example of the first embodiment which is illustrated in FIG. 2B.

In the comparison example illustrated in FIG. 2B, the capacitor C1 (first capacitor) and inductance devices L1 and L3 form a series resonant circuit. Thus, as indicated by the broken line in FIG. 3, a dip may occur at the resonant frequency of the series resonant circuit, which is formed of the capacitor C1 and the inductance devices L1 and L3, in the transmit frequency band (in the example in FIG. 3, at and near 2 GHz).

As described above, the first embodiment employs the configuration in which the input-side winding 31 of the first balun transformer 3 is provided, at its second end, with the second switching circuit 6, and in which the input-side winding 31 of the first balun transformer 3 is separated from the reference potential in the first mode. Thus, as indicated by the solid line in FIG. 3, such a dip as occurs in the comparison example and as is indicated by the broken line in FIG. 3 does not occur in the transmit frequency band when an amplification operation for obtaining the first gain (low gain), which is relatively low, in the first mode is performed.

Second Embodiment

Figure 4A:
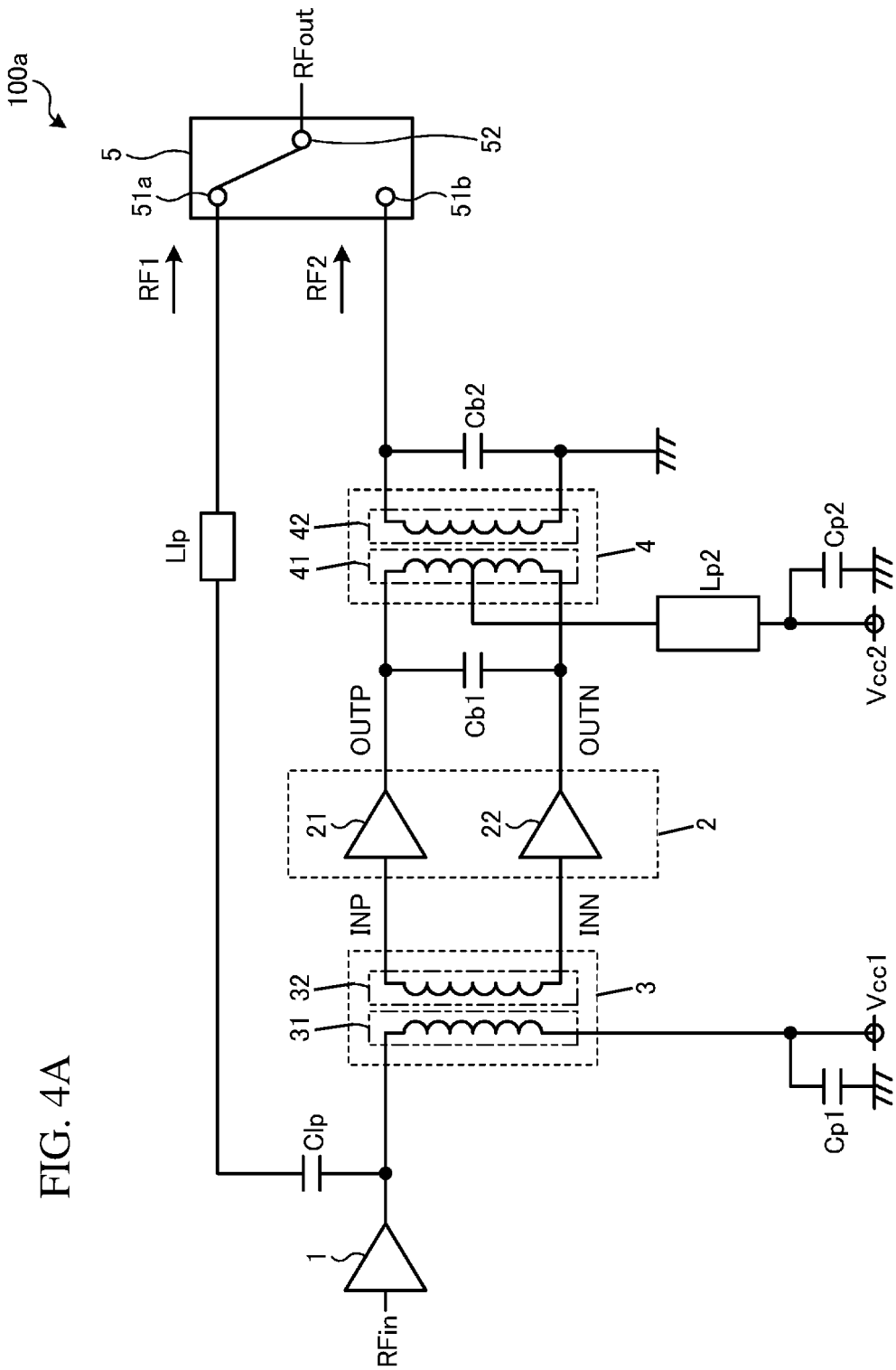
FIG. 4A is a diagram illustrating an exemplary configuration of a power amplifying circuit according to a second embodiment.
Figure 4B:
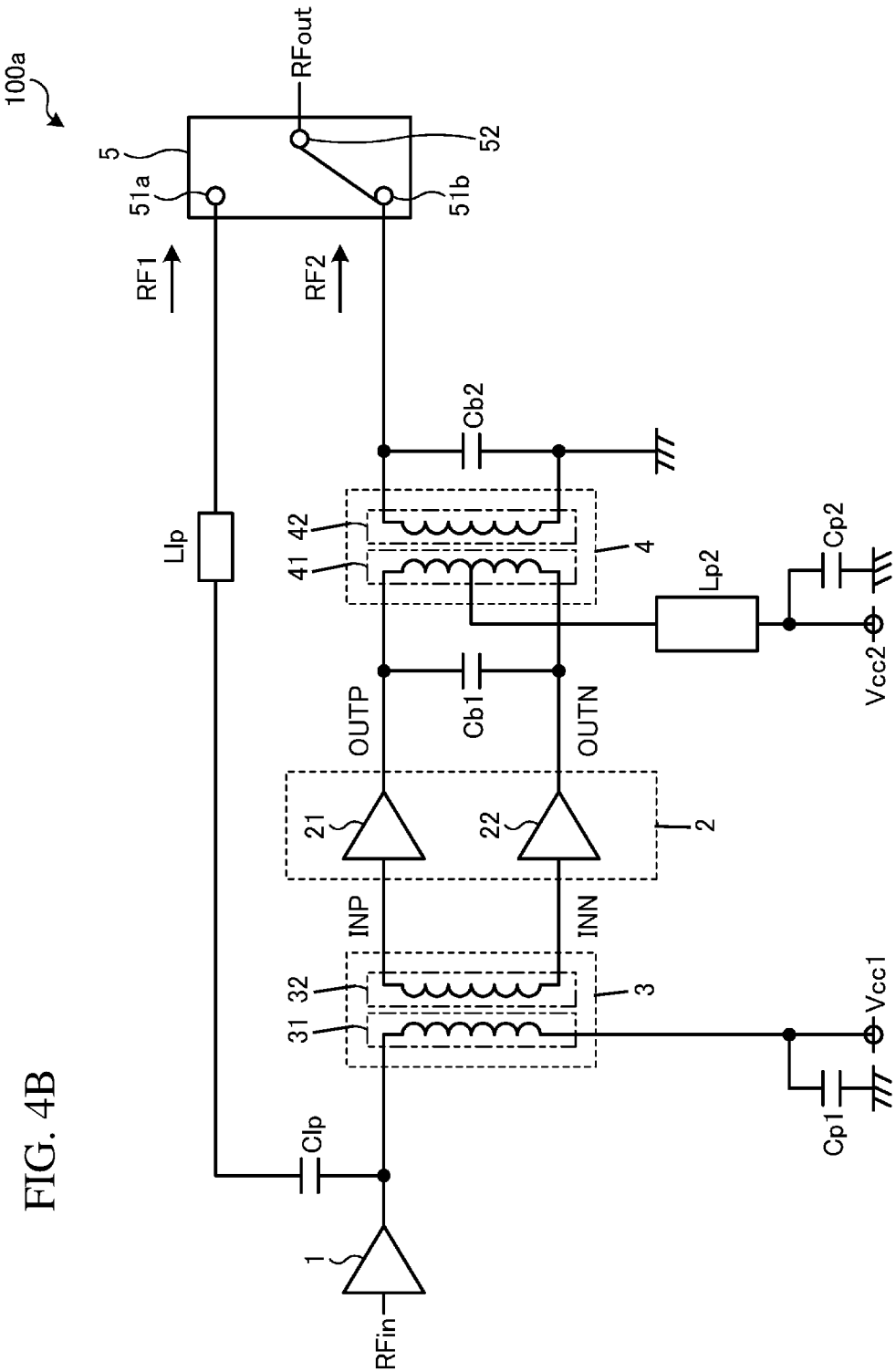
FIG. 4B is a diagram illustrating an exemplary configuration of a power amplifying circuit according to the second embodiment.

FIGS. 4A and 4B are diagrams illustrating an exemplary configuration of a power amplifying circuit according to a second embodiment. FIG. 4A illustrates the state in the first mode. FIG. 4B illustrates the state in the second mode. Components identical to those in the first embodiment are designated with identical reference characters, and will not be described.

Figure 5:
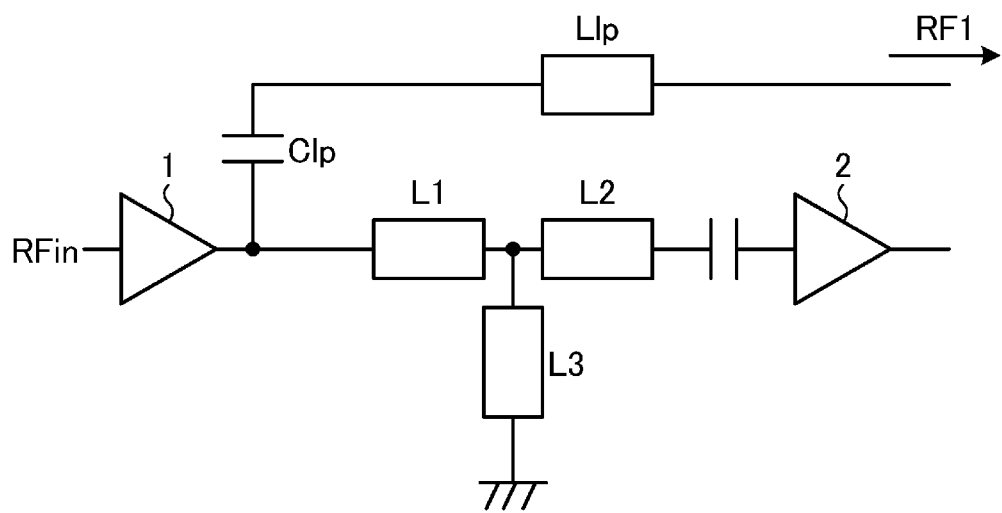
FIG. 5 is a diagram illustrating the equivalent circuit of a first balun transformer, in the first mode, of a power amplifying circuit according to the second embodiment.
Figure 6:
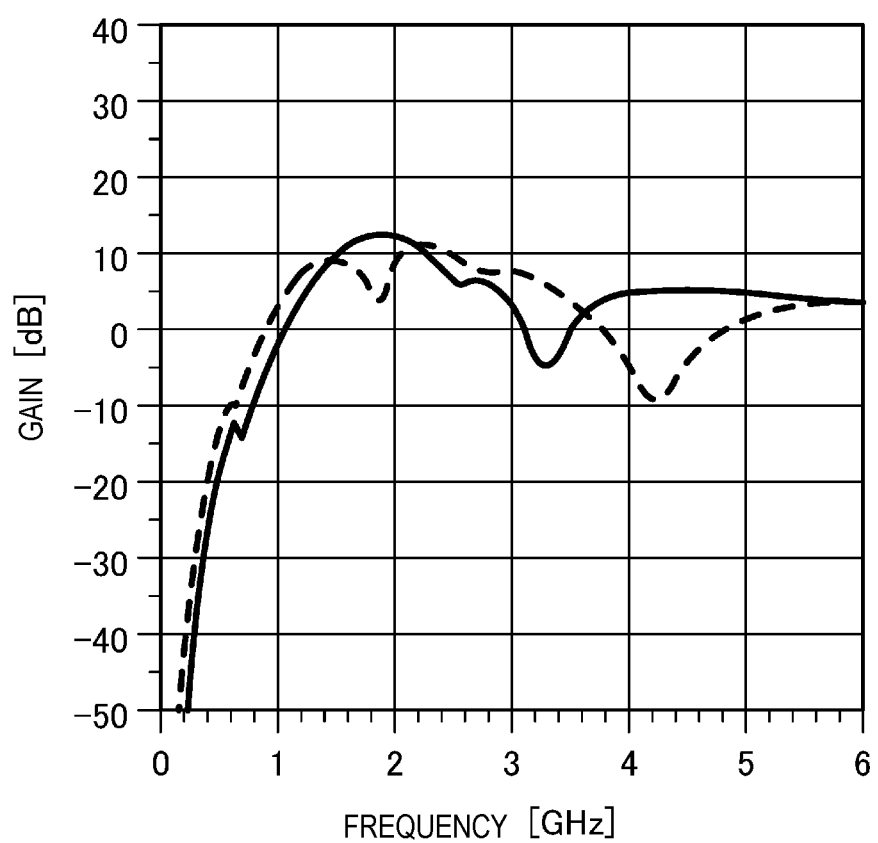
FIG. 6 is a diagram illustrating an exemplary simulation result of frequency-gain characteristics, in the first mode, of a power amplifying circuit according to the second embodiment.

FIG. 5 is a diagram illustrating the equivalent circuit of the first balun transformer, in the first mode, of the power amplifying circuit according to the second embodiment. FIG. 6 is a diagram illustrating an exemplary simulation result of frequency-gain characteristics, in the first mode, of the power amplifying circuit according to the second embodiment. In FIG. 6, the solid line indicates the simulation result, in the first mode, of the power amplifying circuit according to the second embodiment. The broken line indicates the simulation result, in the first mode, of the power amplifying circuit according to the comparison example of the first embodiment which is illustrated in FIG. 2B.

As illustrated in FIGS. 4A and 4B, in a power amplifying circuit 100a according to the second embodiment, the single-ended amplifier 1 is connected to the first end of the input-side winding 31 of the first balun transformer 3. The input-side winding 31 is supplied, at its second end, with the first power supply voltage Vcc1. Thus, as illustrated in FIG. 5, the series resonant circuit described in the comparison example of the first embodiment is not formed. Thus, as indicated by the solid line in FIG. 6, such a dip as occurs in the comparison example and as is indicated by the broken line in FIG. 6 does not occur in the transmit frequency band (in the example illustrated in FIG. 6, at and near 2 GHz).

Figure 7:
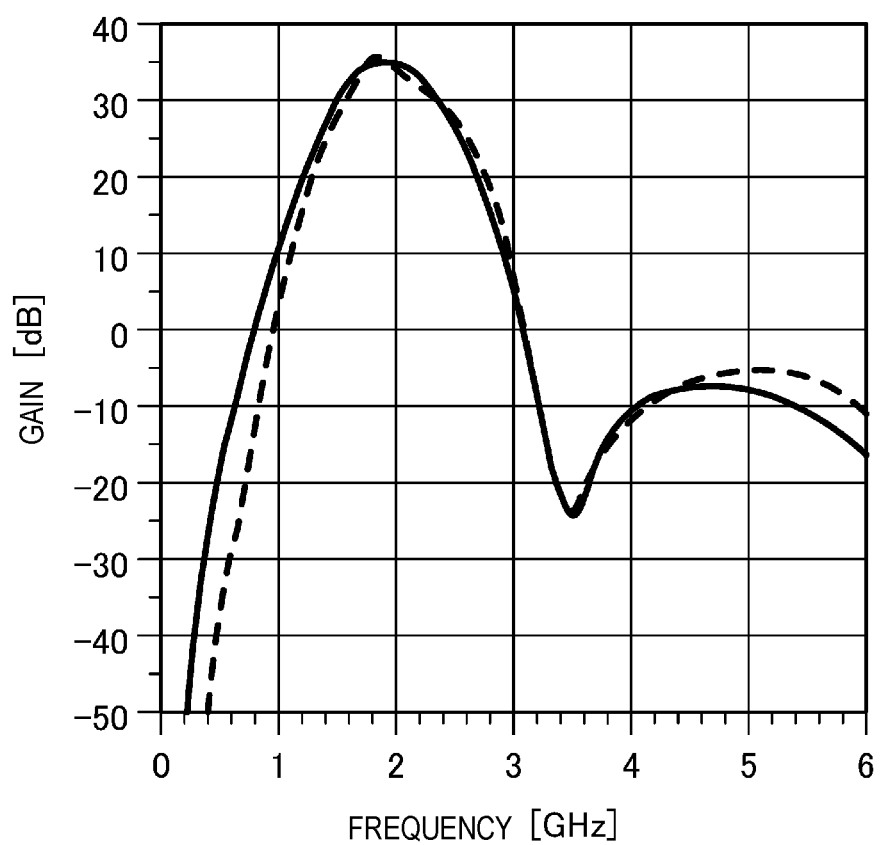
FIG. 7 is a diagram illustrating a comparison example between a simulation result of frequency-gain characteristics, in the second mode, of a power amplifying circuit according to the first embodiment and that of a power amplifying circuit according to the second embodiment.

FIG. 7 is a diagram illustrating a simulation result of frequency-gain characteristics, in the second mode, of the power amplifying circuit according to the second embodiment. In FIG. 7, the solid line indicates the simulation result, in the second mode, of the power amplifying circuit according to the second embodiment. The broken line indicates the simulation result, in the second mode, of the power amplifying circuit according to the first embodiment.

Also in the second mode, as indicated by the solid line in FIG. 7, good gain characteristics, which are similar to those in the configuration of the first embodiment indicated by the broken line in FIG. 7, may be obtained.

The configuration according to the second embodiment described above enables implementation of a power amplifying circuit, with a simpler configuration, which is capable of switching between an amplification operation for obtaining the first gain (low gain), which is relatively low, in the first mode and an amplification operation for obtaining the second gain (high gain), which is relatively high, in the second mode.

Third Embodiment

Figure 8A:
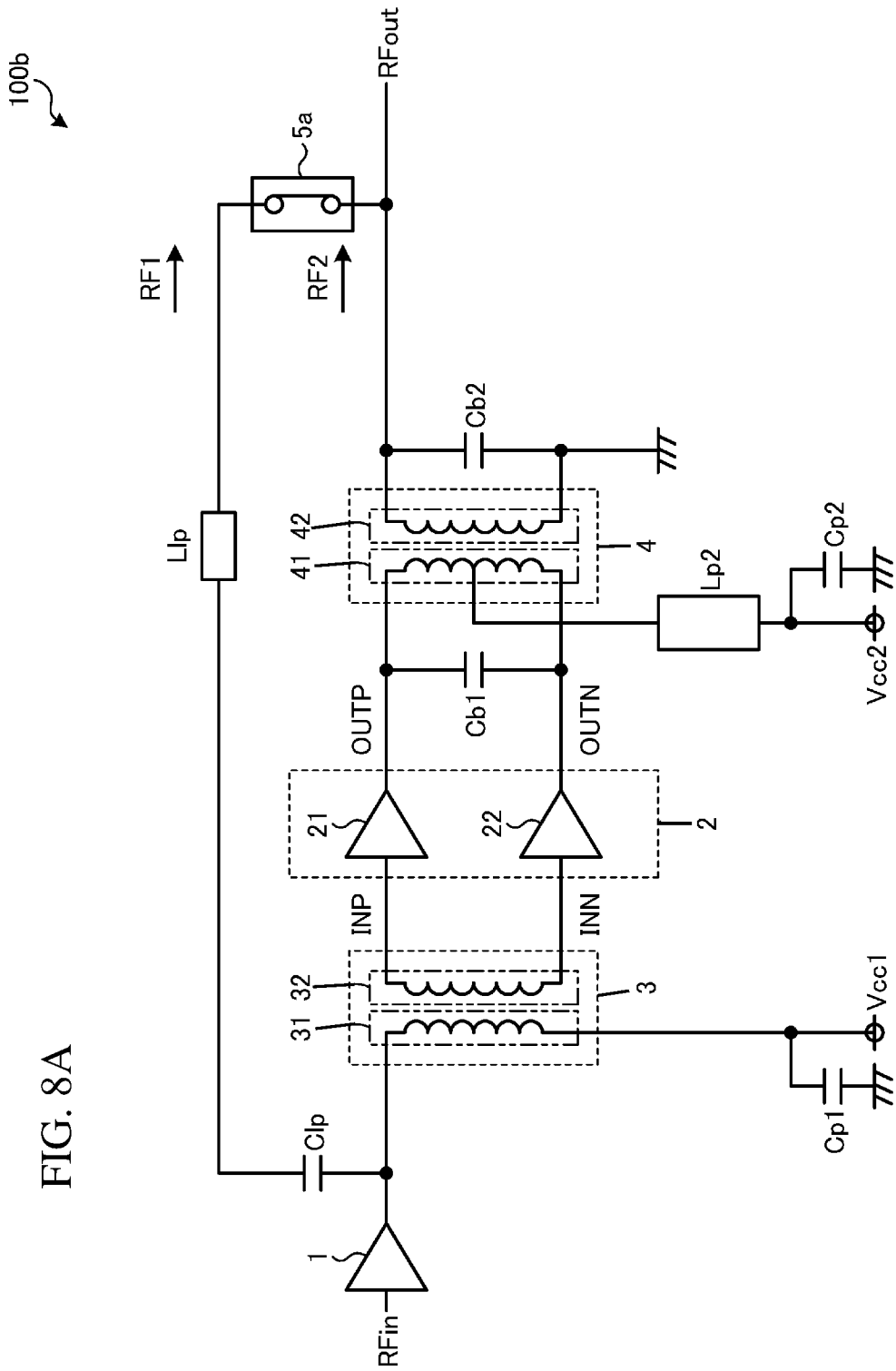
FIG. 8A is a diagram illustrating an exemplary configuration of a power amplifying circuit according to a third embodiment.
Figure 8B:
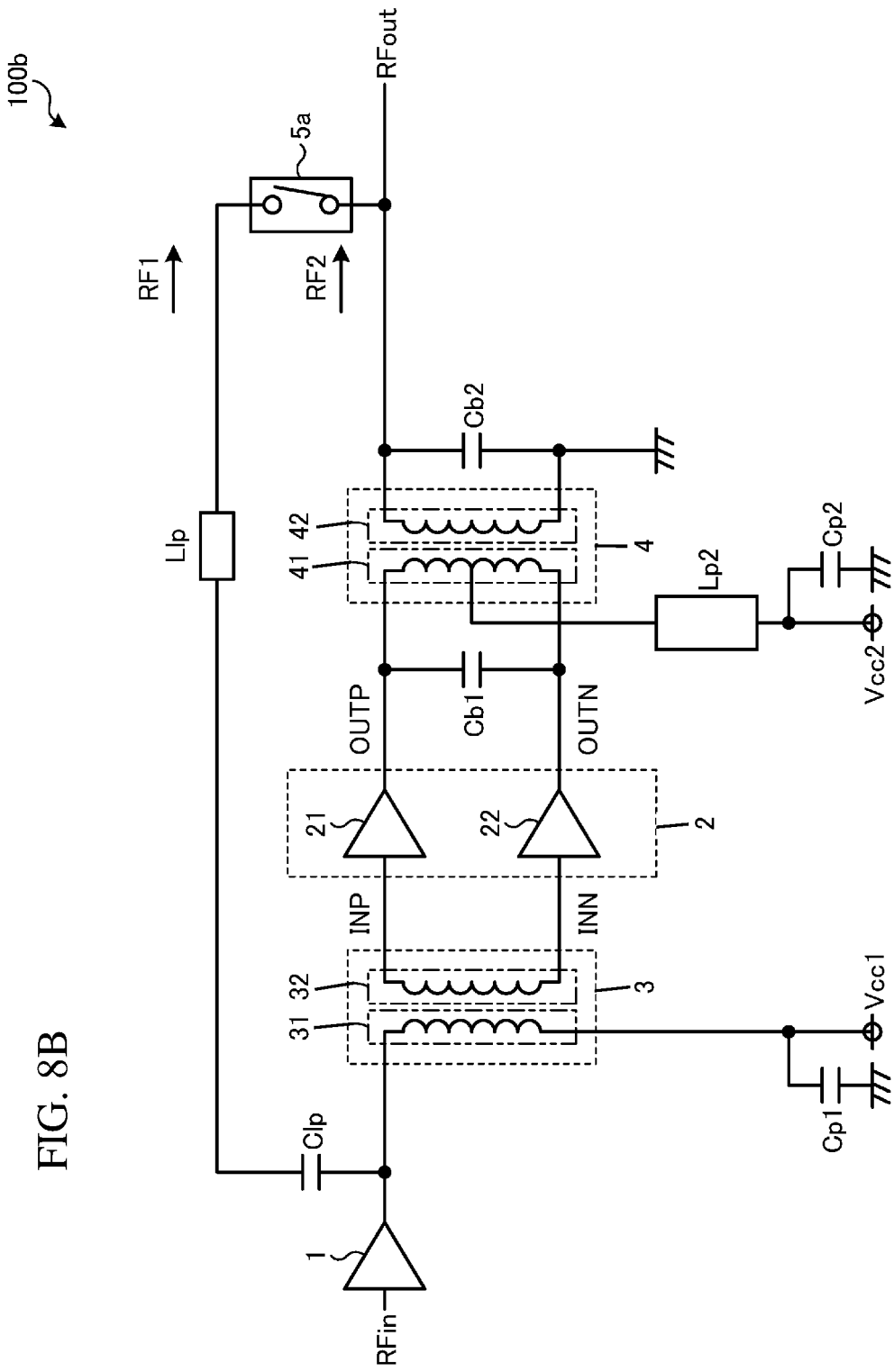
FIG. 8B is a diagram illustrating an exemplary configuration of a power amplifying circuit according to the third embodiment.

FIGS. 8A and 8B are diagrams illustrating an exemplary configuration of a power amplifying circuit according to a third embodiment. FIG. 8A illustrates the state in the first mode. FIG. 8B illustrates the state in the second mode. Components identical to those in the second embodiment are designated with identical reference characters, and will not be described.

As illustrated in FIGS. 8A and 8B, in a power amplifying circuit 100b according to the third embodiment, a first switching circuit 5a is a single pole single throw (SPST) switch. Specifically, in the first mode, the unbalanced-output path of the single-ended amplifier 1 and the unbalanced-output path of the second balun transformer 4 are short-circuited. Thus, an increase in consumption current caused by power loss due to a switching circuit may be suppressed in an amplification operation for obtaining the second gain (high gain), which is relatively high, in the second mode.

Fourth Embodiment

Figure 9A:
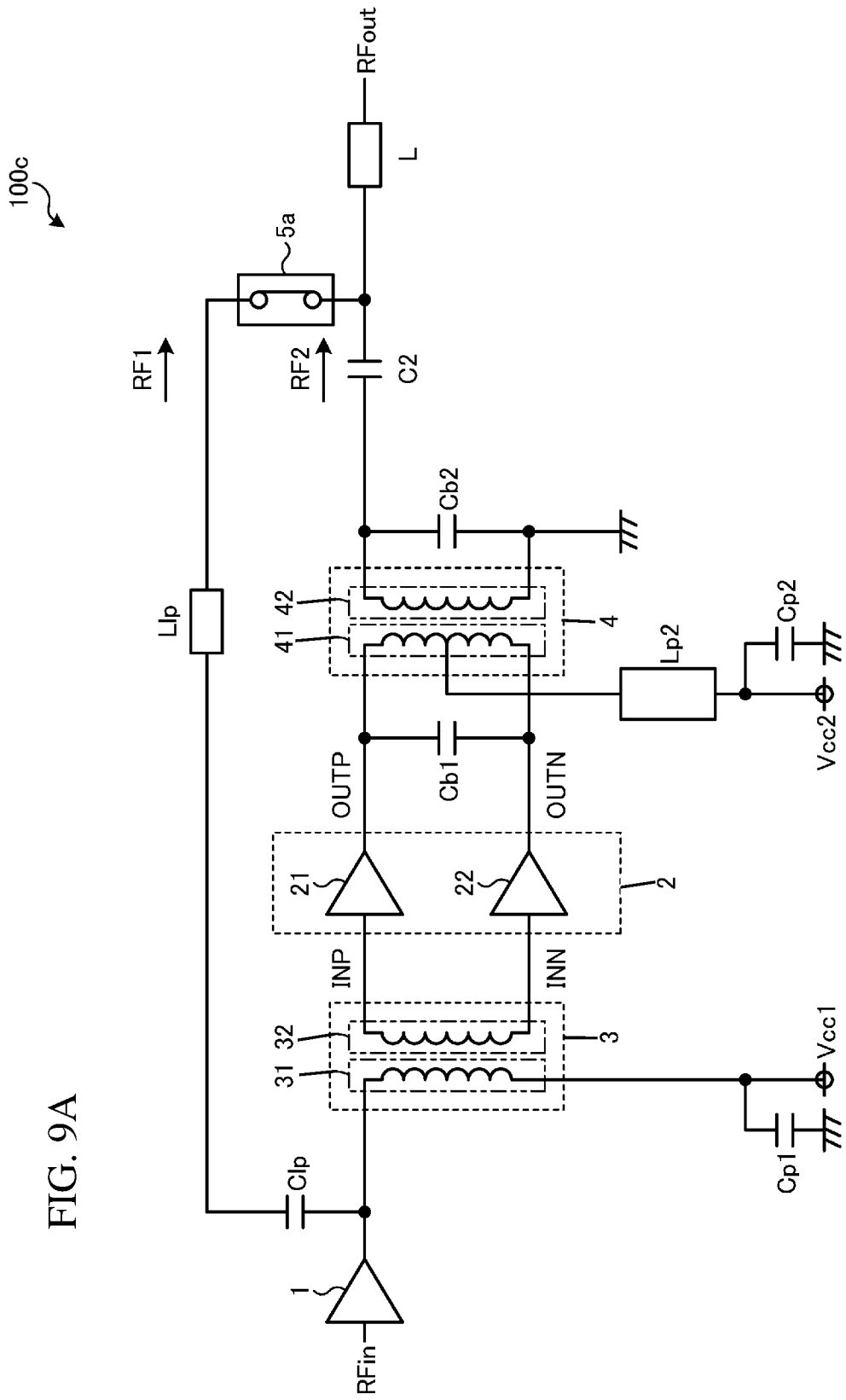
FIG. 9A is a diagram illustrating an exemplary configuration of a power amplifying circuit according to a fourth embodiment.
Figure 9B:
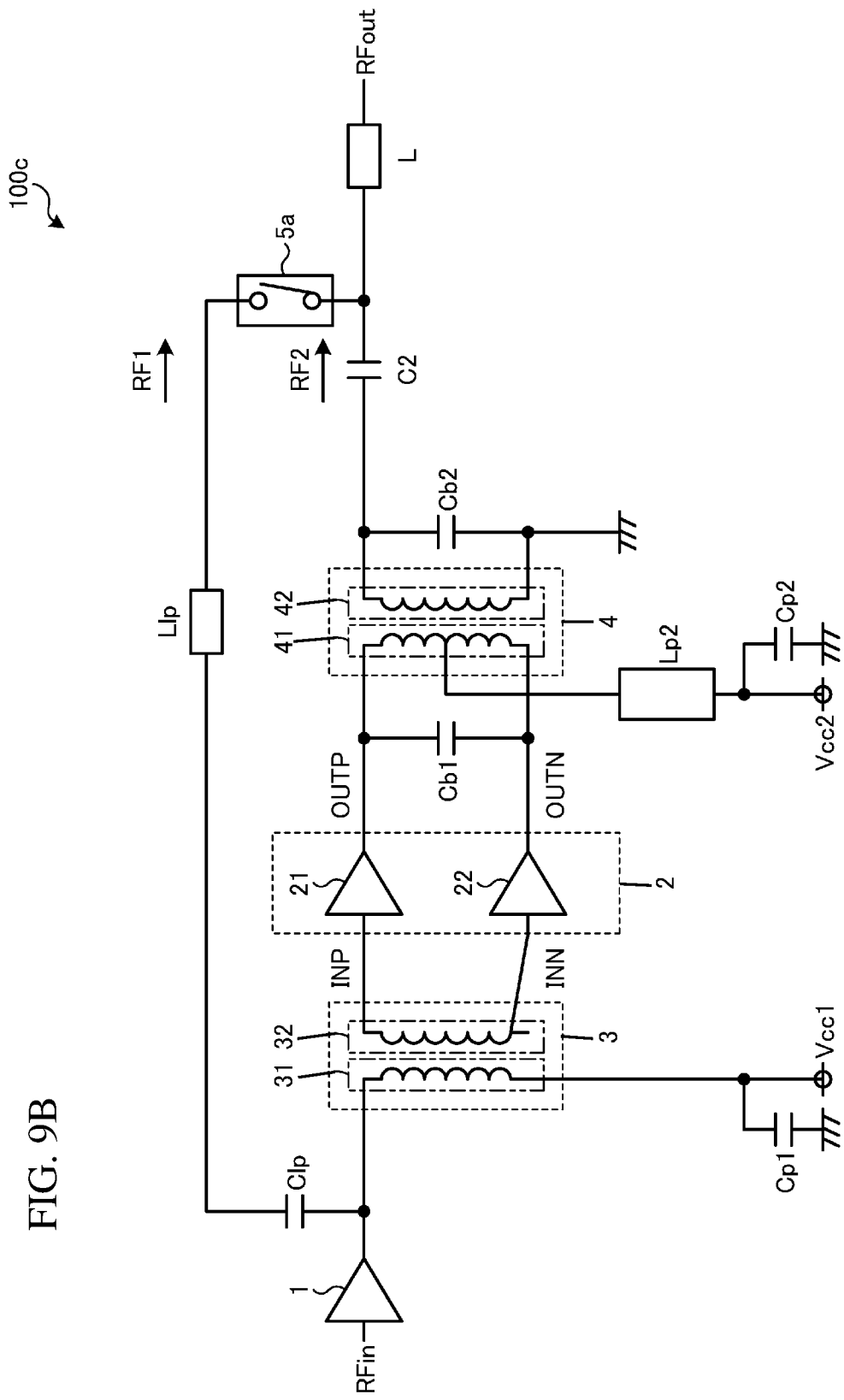
FIG. 9B is a diagram illustrating an exemplary configuration of a power amplifying circuit according to the fourth embodiment.

FIGS. 9A and 9B are diagrams illustrating an exemplary configuration of a power amplifying circuit according to a fourth embodiment. FIG. 9A illustrates the state in the first mode. FIG. 9B illustrates the state in the second mode. Components identical to those in the third embodiment are designated with identical reference characters, and will not be described.

As illustrated in FIGS. 9A and 9B, in a power amplifying circuit 100c according to the fourth embodiment, a capacitor C2 (second capacitor) is disposed on the unbalanced-output path of the second balun transformer 4. Specifically, the capacitor C2 is connected, at its first end, to the first end of the output-side winding 42 of the second balun transformer 4, and is connected, at its second end, to a first end of the first switching circuit 5a.

Figure 10:
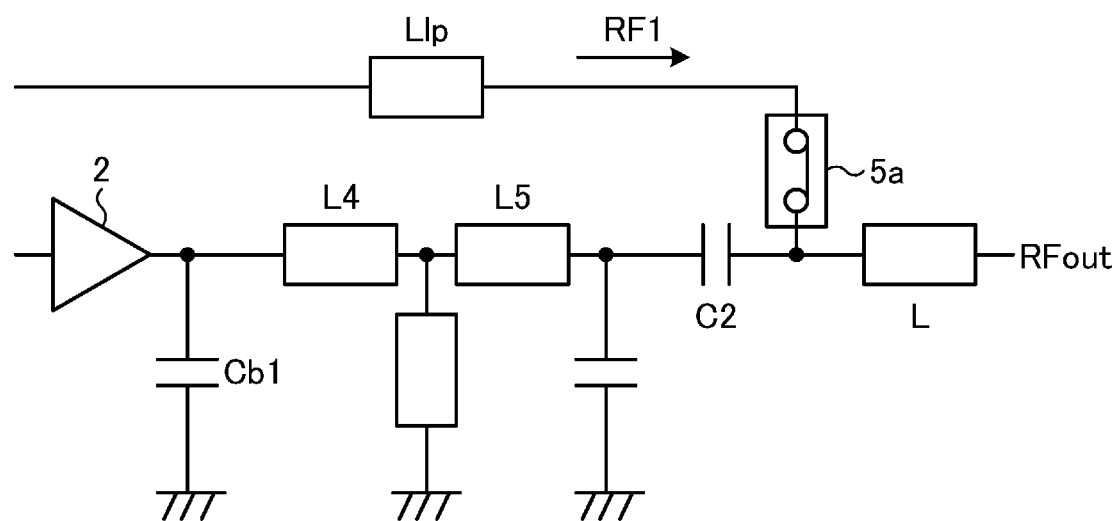
FIG. 10 is a diagram illustrating the equivalent circuit of a second balun transformer, in the first mode, of a power amplifying circuit according to the fourth embodiment.
Figure 11:
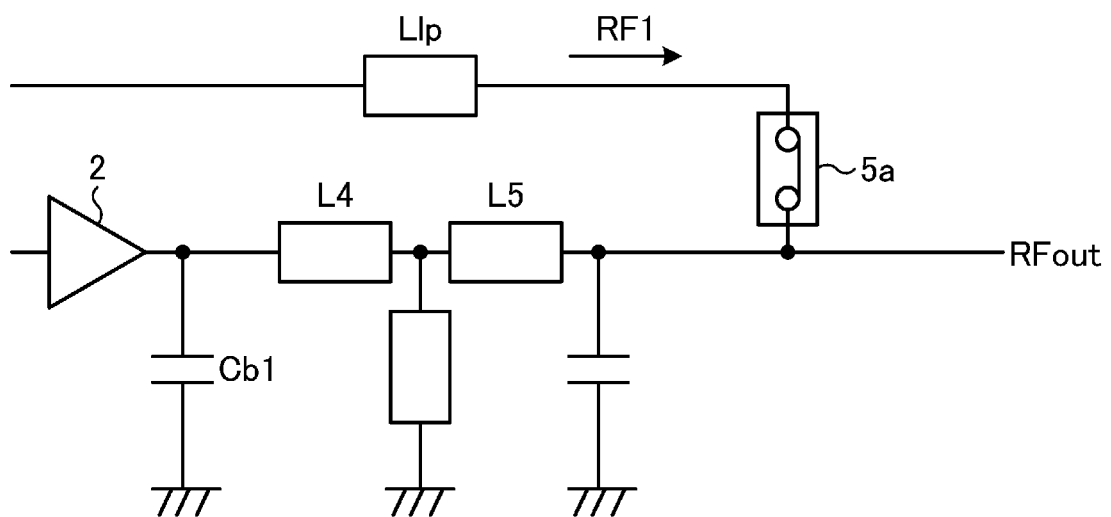
FIG. 11 is a diagram illustrating the equivalent circuit of a second balun transformer, in the first mode, of a power amplifying circuit according to a comparison example of the fourth embodiment.
Figure 12:
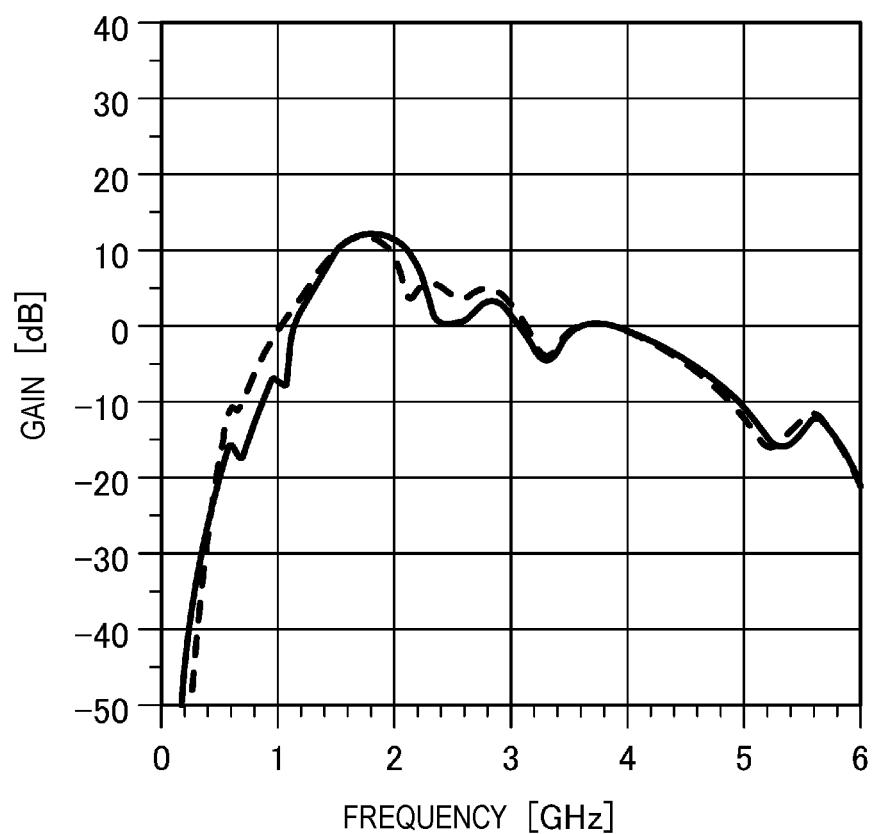
FIG. 12 is a diagram illustrating an exemplary simulation result of frequency-gain characteristics, in the first mode, of a power amplifying circuit according to the fourth embodiment.

FIG. 10 is a diagram illustrating the equivalent circuit of a second balun transformer, in the first mode, of the power amplifying circuit according to the fourth embodiment. FIG. 11 is a diagram illustrating the equivalent circuit of a second balun transformer, in the first mode, of a power amplifying circuit according to a comparison example of the fourth embodiment. FIG. 12 is a diagram illustrating an exemplary simulation result of frequency-gain characteristics, in the first mode, of the power amplifying circuit according to the fourth embodiment. In FIG. 12, the solid line indicates the simulation result, in the first mode, of the power amplifying circuit according to the fourth embodiment. The broken line indicates the simulation result, in the first mode, of the power amplifying circuit according to the comparison example of the fourth embodiment which is illustrated in FIG. 11.

In the comparison example illustrated in FIG. 11, the capacitor Cb1 and inductance devices L4 and L5 form a series resonant circuit. Thus, as indicated by the broken line in FIG. 12, a dip may occur at the resonant frequency of the series resonant circuit, which is formed of the capacitor Cb1 and the inductance devices L4 and L5, in the transmit frequency band (in the example illustrated in FIG. 12, at and near 2 GHz).

In the fourth embodiment, the capacitor C2 is disposed on the unbalanced-output path of the second balun transformer 4. Thus, as indicated by the solid line in FIG. 12, the resonant frequency of the series resonant circuit may be shifted from the transmit frequency band. Thus, a dip in the gain characteristics may occur at a frequency outside the transmit frequency band in an amplification operation for obtaining the first gain (low gain), which is relatively low, in the first mode.

Fifth Embodiment

Figure 13:
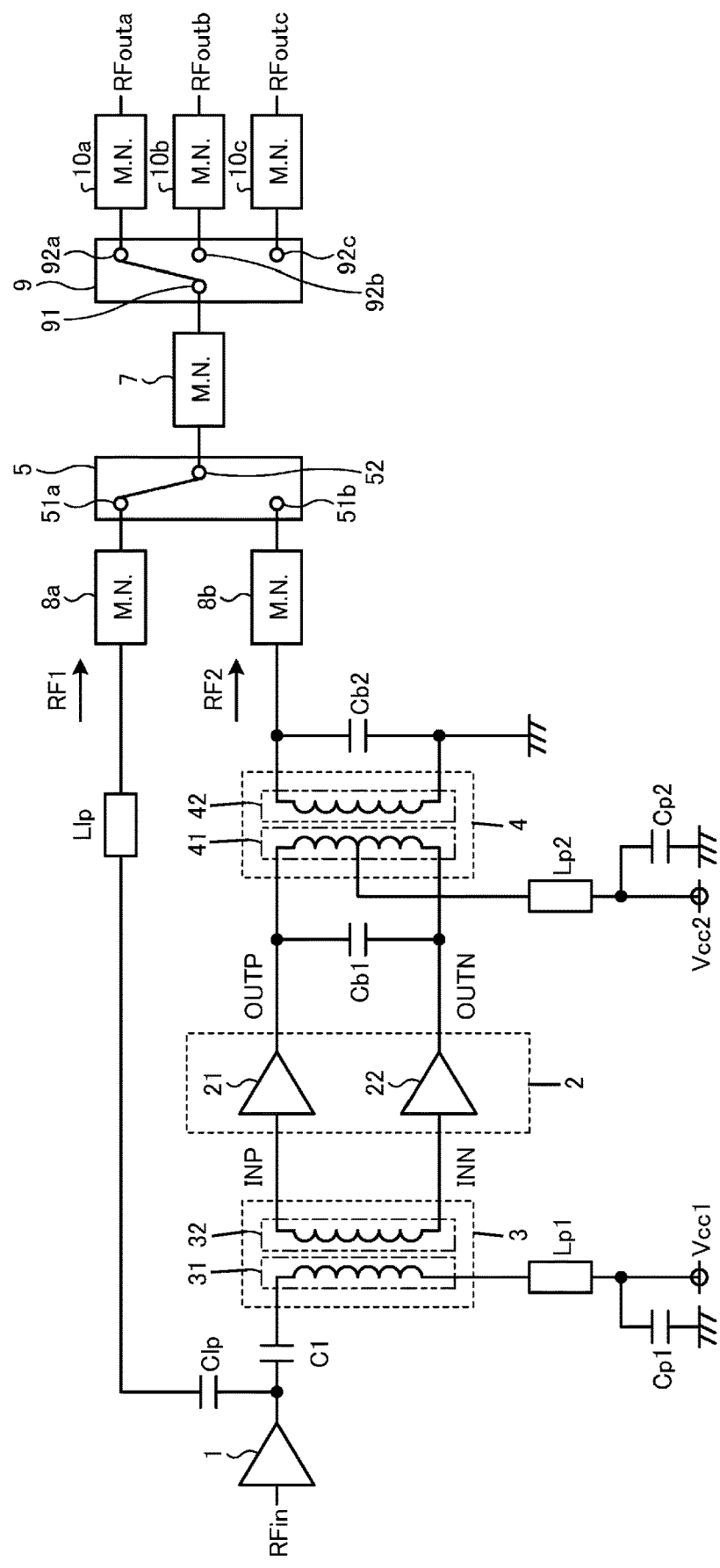
FIG. 13 is a diagram illustrating an exemplary configuration of a power amplifying circuit according to a fifth embodiment.

FIG. 13 is a diagram illustrating an exemplary configuration of a power amplifying circuit according to a fifth embodiment. Components identical to those in the second embodiment are designated with identical reference characters, and will not be described.

As illustrated in FIG. 13, a power amplifying circuit 100d according to the fifth embodiment includes a matching circuit 7, matching circuits 8a and 8b, a third switching circuit 9, and matching circuits 10a, 10b, and 10c in addition to the components in the second embodiment.

The third switching circuit 9 switches the output from the first switching circuit 5, for output, to any of multiple output paths.

The input terminal 51a of the first switching circuit 5 is connected to the matching circuit 8a. The input terminal 51b of the first switching circuit 5 is connected to the matching circuit 8b.

The matching circuit 8a is disposed on the unbalanced-output path of the single-ended amplifier 1. The matching circuit 8a matches impedance between the output from the single-ended amplifier 1 and the input terminal 51a of the first switching circuit 5. The matching circuit 8a forms a part of a matching circuit for matching impedance between the output from the single-ended amplifier 1 and the input terminal 51a of the first switching circuit 5.

The matching circuit 8b is disposed on the unbalanced-output path of the second balun transformer 4. The matching circuit 8b matches impedance between the output from the second balun transformer 4 and the input terminal 51b of the first switching circuit 5. The matching circuit 8b forms a part of a matching circuit for matching impedance between the output from the second balun transformer 4 and the input terminal 51b of the first switching circuit 5.

An output terminal 92a of the third switching circuit 9 is connected to the matching circuit 10a. An output terminal 92b of the third switching circuit 9 is connected to the matching circuit 10b. An output terminal 92c of the third switching circuit 9 is connected to the matching circuit 10c.

The matching circuits 10a, 10b, and 10c match impedance between the output terminals 92a, 92b, and 92c, respectively, of the third switching circuit 9 and the outside connected through the respective output paths.

The matching circuit 7 is connected between the output terminal 52 of the first switching circuit 5 and an input terminal 91 of the third switching circuit 9.

The matching circuit 7 matches impedance between the output terminal 52 of the first switching circuit 5 and the input terminal 91 of the third switching circuit 9. The matching circuit 7 in combination with the matching circuit 8a or the matching circuit 8b matches impedance between the unbalanced output of the single-ended amplifier 1 or the unbalanced output of the second balun transformer 4 and the input terminal 91 of the third switching circuit 9.

The matching circuit 7 may include a matching device provided commonly for impedance matching performed by the matching circuit 8a and impedance matching performed by the matching circuit 8b. For example, in impedance matching performed by the matching circuit 8a, assume that an inductance device, which is connected to the unbalanced-output path of the single-ended amplifier 1, is used in adjustment of impedance. The inductance device may be used also in impedance matching performed by the matching circuit 8b. In this case, without necessarily individual inductance devices included in the matching circuit 8a and the matching circuit 8b, the matching circuit 7 may include an inductance device corresponding to such inductance devices. Thus, the matching device may be used commonly. The matching device that is commonly used may be a capacitor, not an inductance device. Common use of the matching device may decrease the area of the circuit necessary for matching.

The matching circuit 7 may include a matching device which is provided commonly for impedance matching performed by the matching circuit 10a, impedance matching performed by the matching circuit 10b, and impedance matching performed by the matching circuit 10c. That is, like the example described above, the matching device may be used commonly, resulting in a decrease of the area of the circuit.

Sixth Embodiment

Figure 14:
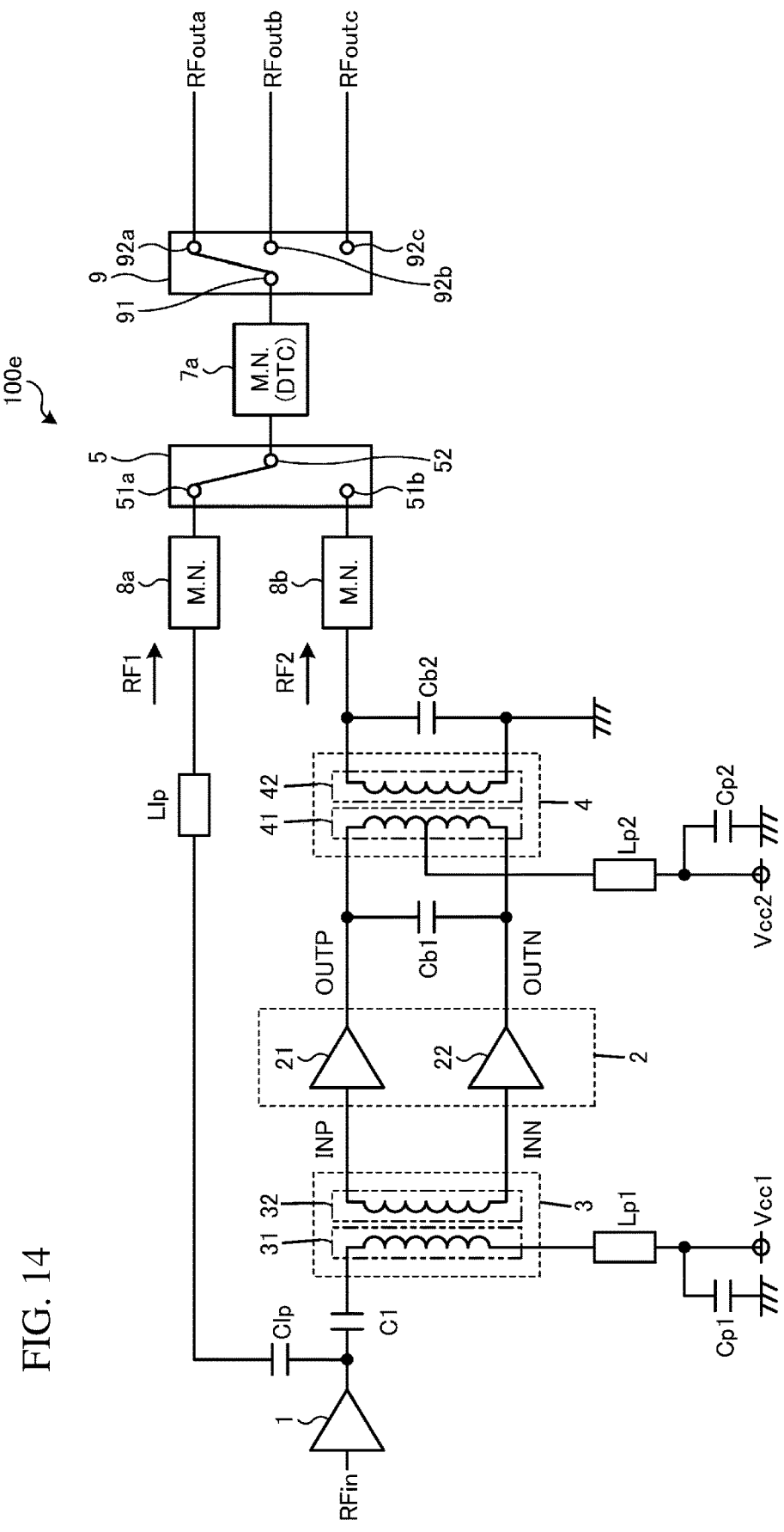
FIG. 14 is a diagram illustrating an exemplary configuration of a power amplifying circuit according to a sixth embodiment.

FIG. 14 is a diagram illustrating an exemplary configuration of a power amplifying circuit according to a sixth embodiment. Components identical to those in the fifth embodiment are designated with identical reference characters, and will not be described.

As illustrated in FIG. 14, a power amplifying circuit 100e according to the sixth embodiment includes a variable matching circuit 7a instead of the matching circuit 7 in the fifth embodiment.

The variable matching circuit 7a includes, for example, a variable capacitor (digital tunable capacitor (DTC)) as an exemplary variable device. The variable capacitor is capable of changing the capacitance on the basis of a control signal which is input from the outside. Not only a variable capacitor but also a variable device (a variable resistor, a variable phase shifter, or a variable inductor) may be used. The variable matching circuit 7a, which has a variable device, is capable of adjusting characteristics in impedance matching.

For example, the variable matching circuit 7a adjusts the capacitance of the variable capacitor. Thus, impedance with the outside connected through an output path is matched. When the variable device is not a device which adjusts its capacitance like a variable capacitor, adjustment of parameters of the variable device enables adjustment of characteristics in impedance matching.

Use of the variable matching circuit 7a eliminates necessity of use of the matching circuits 10a, 10b, and 10c in the fifth embodiment, achieving a further decrease of the area of the circuit necessary for matching. Optimization of matching enables individual impedance optimization in the first mode and the second mode, achieving a smaller consumption current.

The embodiments described above facilitate understanding of the present disclosure, and are not for limited interpretation of the present disclosure. The present disclosure may be changed/improved without necessarily departing from the gist of the present disclosure. The present disclosure also encompasses its equivalence.

The present disclosure may have configurations described below.

(1) A power amplifying circuit according an aspect of the present disclosure includes a single-ended amplifier, a differential amplifier, a first balun transformer, a second balun transformer, and a first switching circuit. The single-ended amplifier operates in a first mode and a second mode different from the first mode. The differential amplifier operates in the second mode. The first balun transformer converts an unbalanced output signal from the single-ended amplifier into a differential signal, and outputs the differential signal to the differential amplifier. The second balun transformer converts a balanced output signal from the differential amplifier into an unbalanced output signal. The first switching circuit outputs the unbalanced output signal from the single-ended amplifier in the first mode, and outputs the unbalanced output signal from the second balun transformer in the second mode.

This configuration enables implementation of a power amplifying circuit, with a simple configuration, which is capable of switching between an amplification operation for obtaining the first gain (low gain), which is relatively low, in the first mode and an amplification operation for obtaining the second gain (high gain), which is relatively high, in the second mode.

(2) The power amplifying circuit according to (1) may further include a first capacitor and a second switching circuit. The first capacitor is disposed between the single-ended amplifier and a first end of an input-side winding of the first balun transformer. The second switching circuit connects a second end of the input-side winding of the first balun transformer to a reference potential in the second mode.

This configuration enables a dip not to occur in the transmit frequency band of the power amplifying circuit in the first mode.

(3) In the power amplifying circuit according to (1), the single-ended amplifier may be connected to a first end of an input-side winding of the first balun transformer. A power supply voltage of the single-ended amplifier may be supplied to a second end of the input-side winding of the first balun transformer.

This configuration enables implementation of a power amplifying circuit, with a simpler configuration, which is capable of switching between an amplification operation for obtaining the first gain (low gain), which is relatively low, in the first mode and an amplification operation for obtaining the second gain (high gain), which is relatively high, in the second mode.

(4) In the power amplifying circuit according to (2) or (3), the first switching circuit may switch, for output, between the unbalanced output signal from the single-ended amplifier and the unbalanced output signal from the second balun transformer.

(5) In the power amplifying circuit according to (2) or (3), the first switching circuit may short-circuit an unbalanced-output path of the single-ended amplifier and an unbalanced-output path of the second balun transformer in the first mode.

This configuration may suppress a decrease of gain due to power loss caused by the switching circuit in an amplification operation for obtaining the second gain (high gain), which is relatively high, in the second mode.

(6) In the power amplifying circuit according to (5), a second capacitor may be disposed on the unbalanced-output path of the second balun transformer. A first end of the second capacitor may be connected to a first end of an output-side winding of the second balun transformer, and a second end of the second capacitor may be connected to a first end of the first switching circuit.

This configuration enables a dip in the gain characteristics in the first mode to occur at a frequency outside the transmit frequency band.

(7) The power amplifying circuit according to (4) may further include a third switching circuit and a matching circuit. The third switching circuit switches, for output, output of the first switching circuit to any of output paths. The matching circuit is disposed between the first switching circuit and the third switching circuit.

This configuration enables a matching device to be used commonly, achieving a decrease of the area of the circuit.

(8) In the power amplifying circuit according to (7), the matching circuit may be a variable matching circuit that is capable of adjusting characteristics.

This configuration enables the area of the circuit necessary for matching to be further decreased. Optimization of matching enables individual impedance optimization in the first mode and the second mode, achieving a small consumption current.

The present disclosure enables a power amplifying circuit, which is capable of switching gain, to be obtained with a simple configuration.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A power amplifying circuit comprising:
   a single-ended amplifier configured to operate in a first mode and a second mode, the second mode being different from the first mode;
   a differential amplifier configured to operate in the second mode;
   a first balun transformer configured to convert an unbalanced output signal from the single-ended amplifier into a differential signal, and configured to output the differential signal to the differential amplifier;
   a second balun transformer configured to convert a balanced output signal from the differential amplifier into an unbalanced output signal; and
   a first switching circuit configured to selectively output the unbalanced output signal from the single-ended amplifier in the first mode, or the unbalanced output signal from the second balun transformer in the second mode.
2. The power amplifying circuit according to claim 1, further comprising:
   a first capacitor that is between the single-ended amplifier and a first end of an input-side winding of the first balun transformer; and a second switching circuit configured to selectively connect a second end of the input-side winding of the first balun transformer to a reference potential in the second mode.

3. The power amplifying circuit according to claim 1,
wherein the single-ended amplifier is connected to a first end of an input-side winding of the first balun transformer, and
wherein a power supply voltage of the single-ended amplifier is supplied to a second end of the input-side winding of the first balun transformer.

4. The power amplifying circuit according to claim 2, wherein the first switching circuit is configured to short-circuit an unbalanced-output path of the single-ended amplifier and an unbalanced-output path of the second balun transformer in the first mode.

5. The power amplifying circuit according to claim 3, wherein the first switching circuit is configured to short-circuit an unbalanced-output path of the single-ended amplifier and an unbalanced-output path of the second balun transformer in the first mode.

6. The power amplifying circuit according to claim 4, further comprising:
a second capacitor in the unbalanced-output path of the second balun transformer,
wherein a first end of the second capacitor is connected to a first end of an output-side winding of the second balun transformer, and a second end of the second capacitor is connected to a first end of the first switching circuit.

7. The power amplifying circuit according to claim 5, further comprising:
a second capacitor in the unbalanced-output path of the second balun transformer,
wherein a first end of the second capacitor is connected to a first end of an output-side winding of the second balun transformer, and a second end of the second capacitor is connected to a first end of the first switching circuit.

8. The power amplifying circuit according to claim 1, further comprising:
a third switching circuit configured to selectively connect an output of the first switching circuit to one of a plurality of output paths; and
a matching circuit that is between the first switching circuit and the third switching circuit.

9. The power amplifying circuit according to claim 8, wherein the matching circuit is a variable matching circuit that is configured to adjust characteristics of the output signal from the first switching circuit.

10. A power amplifying circuit comprising:
a single-ended amplifier configured to operate in a first mode and a second mode, the second mode being different from the first mode;
a differential amplifier configured to operate in the second mode;
a first balun transformer configured to convert an unbalanced output signal from the single-ended amplifier into a differential signal, and configured to output the differential signal to the differential amplifier;
a second balun transformer configured to convert a balanced output signal from the differential amplifier into an unbalanced output signal; and
a first switching circuit configured to selectively output the unbalanced output signal from the single-ended amplifier in the first mode, and configured to output the unbalanced output signal from the second balun transformer in the second mode,
wherein the single-ended amplifier is connected to a first end of an input-side winding of the first balun transformer, and
wherein a power supply voltage of the single-ended amplifier is supplied to a second end of the input-side winding of the first balun transformer.

* * * * *